United States Patent
Künne et al.

(10) Patent No.: US 12,072,819 B2
(45) Date of Patent: Aug. 27, 2024

(54) CONNECTION COMPONENT FOR BRANCHING OFF A SINGLE ELECTRON MOTION

(71) Applicants: Rheinisch-Westfälische Technische Hochschule (RWTH) Aachen, Aachen (DE); Forschungszentrum Jülich GmbH, Jülich (DE)

(72) Inventors: Matthias Künne, Aachen (DE); Hendrik Bluhm, Aachen (DE); Lars Schreiber, Aachen (DE)

(73) Assignees: Rheinisch-Westfälische Technische Hochschule (RWTH) Aachen, Aachen (DE); Forschungszentrum Jülich GmbH, Jülich (DE)

( * ) Notice: Subject to any disclaimer, the term of this patent is extended or adjusted under 35 U.S.C. 154(b) by 358 days.

(21) Appl. No.: 17/642,484

(22) PCT Filed: Sep. 21, 2020

(86) PCT No.: PCT/DE2020/100812
§ 371 (c)(1),
(2) Date: Mar. 11, 2022

(87) PCT Pub. No.: WO2021/052539
PCT Pub. Date: Mar. 25, 2021

(65) Prior Publication Data
US 2022/0344565 A1  Oct. 27, 2022

(30) Foreign Application Priority Data

Sep. 20, 2019  (DE) ..................... 10 2019 125 351.9
Jun. 10, 2020  (DE) ..................... 10 2020 115 493.3

(51) Int. Cl.
*G06F 13/20*  (2006.01)
*G06N 10/40*  (2022.01)
(Continued)

(52) U.S. Cl.
CPC ............. *G06F 13/20* (2013.01); *G06N 10/40* (2022.01); *H01L 29/423* (2013.01);
(Continued)

(58) Field of Classification Search
CPC ....................................................... G06F 13/20
(Continued)

(56) References Cited

U.S. PATENT DOCUMENTS 8,164,082 B2  4/2012  Friesen
11,171,225 B2  11/2021  Voinigescu et al.
(Continued)

FOREIGN PATENT DOCUMENTS

AU  2007200501 A1  8/2008
DE  102019202661 A1  8/2020
(Continued)

OTHER PUBLICATIONS

G.J. Schinner et al., "Confinement and Interaction of Single Indirect Excitons in a Voltage-Controlled Trap Formed Inside Double InGaAs Quantum Wells", New Journal of Physics, vol. 110, issue. 12, pp. 127403-127408, Mar. 19, 2013.
(Continued)

*Primary Examiner* — Tomi Skibinski
(74) *Attorney, Agent, or Firm* — Smartpat PLC

(57) ABSTRACT

An electronic component (10) is formed by a semiconductor component or a semiconductor-like structure having gate electrode assemblies (16, 18, 20) for moving a quantum dot (52). The electronic component (10) comprises a substrate (12) having a two-dimensional electron gas or electron hole gas. Electrical contacts connect the gate electrode assemblies (16, 18, 20) to voltage sources. A first gate electrode assembly (16) having gate electrodes (22, 24), which is arranged on a surface (14) of the electronic component in order to produce a potential well (50) in the substrate (12).
(Continued)

The gate electrode assembly (16) has parallel electrode fingers (32, 34), wherein the electrode fingers (32, 34) are interconnected in a periodically alternating manner, which causes an almost continuous movement of the potential well (50) through the substrate (12), whereby a quantum dot (52) is transported in one direction together with this potential well (50).

13 Claims, 2 Drawing Sheets

(51) Int. Cl.
| | | |
|---|---|---|
| *H01L 29/423* | (2006.01) | |
| *H01L 29/66* | (2006.01) | |
| *H03K 17/92* | (2006.01) | |
| *H10N 60/10* | (2023.01) | |
| *H10N 69/00* | (2023.01) | |

(52) U.S. Cl.
CPC .. *H01L 29/42316* (2013.01); *H01L 29/66977* (2013.01); *H03K 17/92* (2013.01); *H10N 60/11* (2023.02); *H10N 60/128* (2023.02); *H10N 69/00* (2023.02); *G06F 2213/40* (2013.01)

(58) Field of Classification Search
USPC .......................................................... 257/39
See application file for complete search history.

(56) References Cited

U.S. PATENT DOCUMENTS

| | | | |
|---|---|---|---|
| 2008/0185576 A1* | 8/2008 | Hollenberg | G06N 10/00 257/14 |
| 2015/0279981 A1 | 10/2015 | Eriksson et al. | |
| 2016/0125310 A1 | 5/2016 | Hollenberg et al. | |
| 2016/0275410 A1 | 9/2016 | Rogge et al. | |
| 2017/0317203 A1 | 11/2017 | Petta et al. | |
| 2018/0226451 A1 | 8/2018 | Dzurak et al. | |
| 2020/0176569 A1 | 6/2020 | Singh et al. | |
| 2020/0312990 A1 | 10/2020 | Roberts et al. | |
| 2021/0279134 A1 | 9/2021 | Versluis et al. | |
| 2022/0005943 A1 | 1/2022 | Roberts et al. | |
| 2022/0172097 A1 | 6/2022 | Langrock et al. | |
| 2023/0197833 A1 | 6/2023 | Thomas et al. | |

FOREIGN PATENT DOCUMENTS

| | | | |
|---|---|---|---|
| EP | 2075745 | A1 | 7/2009 |
| EP | 2560133 | A1 | 2/2013 |
| EP | 3016035 | A3 | 1/2019 |
| EP | 4075153 | A1 | 10/2022 |
| JP | S5994458 | U | 6/1984 |
| WO | 2014146162 | A1 | 9/2014 |
| WO | 2017020095 | A1 | 2/2017 |
| WO | 2017213651 | A1 | 12/2017 |
| WO | 2018062991 | A1 | 4/2018 |
| WO | 2018236403 | A1 | 12/2018 |

OTHER PUBLICATIONS

High, A. A., et al. "Trapping indirect excitons in a GaAs quantum-well structure with a diamond-shaped electrostatic trap." Physical review letters 103.8 (2009): 087403.
Horsman, Clare, et al. "Surface code quantum computing by lattice surgery." New Journal of Physics 14.12 (2012): 123011.
Künne et al., co-pending U.S. Appl. No. 17/642,527; national phase entry of PCT/DE2020/100811.
Künne et al., co-pending U.S. Appl. No. 17/642,677; national phase entry of PCT/DE2020/100809.
Künne et al., co-pending U.S. Appl. No. 17/761,832; national phase entry of PCT/DE2020/100814.
Künne et. al., co-pending U.S. Appl. No. 17/636,522; national phase entry of PCT/DE2020/100766.
Künne et. al., co-pending U.S. Appl. No. 17/761,885; national phase entry of PCT/DE2020/100810.
Schinner, G. J., et al. "Electrostatically trapping indirect excitons in coupled In x Ga 1—x As quantum wells." Physical Review B 83.16 (2011): 165308.
Veit Langrock, Numerical and theoretical investigation of long-range coherent electron shuttling devices in Silicon/Silicon-Germanium quantum wells for scalable quantum computing, Nov. 30, 2017, retrieved online from https://www.quantuminfo.physik.rwth-aachen.de/global/show_document.asp?id=aaaaaaaaabbnooi.
Electron spins in few-electron, lateral quantum dots, Laurens Henry Willems Van Beveren, (Tech Univ DELFT), Thesis (Year: 2005).

\* cited by examiner

CONNECTION COMPONENT FOR BRANCHING OFF A SINGLE ELECTRON MOTION

TECHNICAL FIELD

The disclosure relates to an electronic component which is formed by a semiconductor component or a semiconductor-like structure having gate electrode assemblies for moving a quantum dot. The disclosure further relates to a method for such an electronic component.

BACKGROUND

Conventional computers use semiconductor components with integrated circuits. These circuits always work with systems which are based on a logical "0" or "1"—i.e. the switch is "on" or "off". In semiconductor memories, this is realized in that the potential is either above or below a threshold value. These two states form the smallest unit in computers and are referred to as "bits".

These semiconductor components often consist of doped silicon elements in order to realize the circuits. For example, transistor circuits can be arranged in such semiconductor components and linked to form a logic circuit. Through continuously improving chemical and physical manufacturing processes, these semiconductor components can now be produced with increasingly extreme compactness. However, this compactness has reached its physical limits. The density of the circuits as well as the temperature often leads to problems in such semiconductor components. In this manner optimizations in particular can be achieved through several layer models, higher switching speeds, or the selection of the semiconductor material. Nevertheless, the computing power is often insufficient for many applications, e.g. in cryptographic technology or when calculating weather or climate models, due to the enormous amounts of data.

To significantly increase computing power, models for so-called quantum computers have long been known. For a variety of reasons, though, it has not yet been technically possible to implement them. The models of quantum computers are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

The principle of electron spin qubits is always the same, regardless of the material system selected. A semiconductor heterostructure serves as the substrate in this case. The semiconductor heterostructure comprises a two-dimensional electron gas (2DEG). Semiconductor heterostructures are monocrystalline layers of semiconductors with different compositions grown on top of each other. These layer structures provide numerous technically relevant quantization effects in terms of their electronic and optical properties. For this reason, they are particularly suitable for use in the production of microelectronic components. The most important combination of materials at the present time for the production of semiconductor heterostructures is the GaAs/AlGaAs system.

Semiconductor heterostructures form so-called quantum films at the interfaces between different materials. These arise in particular because of the different energy levels in the two materials. The defined energy distribution resulting therefrom causes charge carriers from the surrounding area to collect in the quantum film. Their freedom of movement is largely restricted to the layer in the film, and they form the two-dimensional electron gas (2DEG).

A nanoscopic material structure is referred to as a quantum dot. Semiconductor materials are particularly suitable for this. The mobility of the charge carriers, both electrons and holes, is so restricted in a quantum dot that their energy can no longer assume continuous values, and can thus only assume discrete values. Using nanoscale gate electrodes (also referred to as gates), which are applied to the surface of the component, the potential landscape within the two-dimensional electron gas (2DEG) is shaped in such a manner that individual electrons can be captured in the quantum dots. The spins of these electrons then serve as the basis for the formation of a logical qubit.

US 2017/0317203 A1 discloses a quantum dot device comprising at least three conductive layers and at least two insulating layers. The three conductive layers are electrically insulated from one another. It is described there that one conductive layer is composed of a different material than the other two conductive layers. The conductive layers can include or be composed entirely of aluminum, gold, copper, or polysilicon, for example. The insulating layers, on the other hand, are composed of silicon oxide, silicon nitride, and/or aluminum oxide, for example. The connections between the conductive layers and the insulating layers can cause, inter alia, individual electrons to be shuttled through quantum dots of the device using voltage pulses.

In this quantum dot device, an electron is confined in a potential well. Through quantum mechanical tunneling, an electron is moved from quantum dot to quantum dot. This can lead to inaccuracies or falsifications of the information regarding the quantum mechanical state when an electron moves over longer distances.

WO 2017/020095 A1 discloses a scalable architecture for a processing device for performing quantum processing. The architecture is based on full-silicon CMOS fabrication technology. Transistor-based control circuits are used together with floating gates to operate a two-dimensional array of qubits. The qubits are defined by the spin states of a single electron, which is trapped in a quantum dot. A higher level is described here, meaning how individual qubits can be electrically driven, for example via transistors, etc., including qubit operation and readout. Although reference is made to a "scalable architecture", the array shown does not allow any real scaling, meaning inter alia integration of cryogenic electronics, since no space can be created between the qubits.

U.S. Pat. No. 8,164,082 B2 describes a spin bus quantum computer architecture comprising a spin bus comprising of a plurality of strongly coupled and always on qubits defining a string of spin qubits. A plurality of information-bearing qubits are arranged adjacent to a qubit of the spin bus. Electrodes are formed to the information-bearing qubits and the spin bus qubits to allow control of the establishment and breaking of coupling between qubits in order to allow control of the establishment and breaking of coupling between each information-bearing qubit and the spin bus qubit adjacent to it. The spin bus architecture allows rapid and reliable long-range coupling of qubits.

EP 3 016 035 B1 describes a processing apparatus and methods to operate the same, and particularly, but not exclusively, the invention relates to a quantum processing apparatus which is controllable to perform adiabatic quantum computations.

SUMMARY

A quantum processor has the following features: a plurality of qubit elements and a control structure comprising a plurality of control members, wherein each control member is arranged to control a plurality of qubit elements. The control structure is controllable to perform quantum computation using the qubit elements, wherein a quantum state of the qubit elements is encoded in the nuclear or electron spin of one or more donor atoms. The donor atoms are arranged in a plane embedded in a semiconducting structure. A first set of donor atoms is arranged to encode quantum information related to the quantum computation. A second set of donor atoms is arranged to facilitate electromagnetic coupling between one or more of the first set of donor atoms. The donor atoms of the first set are arranged in a two-dimensional matrix arrangement. The plurality of control members comprises a first set of elongated control members arranged in a first plane above the plane comprising the donor atoms. A second set of elongated control members are provided which are arranged in a second plane below the plane comprising the donor atoms.

To implement a universal quantum computer, it must be possible to couple the qubits over distances of at least a few micrometers, in particular to create space for local control electronics. Structures and structural elements must be provided which allow a quantum dot to be transported to different targets in order to be able to construct logic circuits. There are already approaches in the prior art in which one or two-dimensional arrays have been built from separate quantum dots, through which electrons can then be transported. Due to the very large number of gate electrodes required and corresponding voltages to be set, coupling over several micrometers is impossible to implement or can only be implemented with significant effort using this approach.

While operations on individual qubits can already be checked and evaluated to a satisfactory extent, the ability to couple qubits is probably the main problem yet to be solved in order to realize complex logic circuits and implement a universal quantum computer.

An object of the disclosure is to eliminate the disadvantages of the prior art and to provide an electronic component which allows logic circuits to be realized with quantum dots, wherein branches are provided in the logic circuits.

Such an electronic component is formed by a semiconductor component or a semiconductor-like structure having gate electrode assemblies for moving a quantum dot, comprising
  a) a substrate with a two-dimensional electron gas or electron hole gas;
  b) electrical contacts for connecting the gate electrode assemblies to voltage sources;
  c) a first gate electrode assembly having gate electrodes, which is arranged on a surface of the electronic component, for producing a potential well in the substrate;
  d) the first gate electrode assembly having parallel electrode fingers, wherein
  e) the electrode fingers are interconnected in a periodically alternating manner, which causes an almost continuous movement of the potential well through the substrate, whereby a quantum dot is transported in one direction together with this potential well.
  f) a second gate electrode assembly having gate electrodes is provided, which is provided with a different direction at a branch to the first gate electrode assembly, for generating a second potential well in the substrate,
  g) the second gate electrode assembly has parallel electrode fingers, wherein
  h) the electrode fingers are interconnected in a periodically alternating manner, which causes an almost continuous movement of the potential well through the substrate, whereby a quantum dot in this potential well can be moved in a different direction of travel.

The object is further achieved by a method for such an electronic component in which a phase-shifted voltage is applied to the interconnected gate electrodes, which causes an almost continuous movement of the potential well through the substrate, whereby a quantum dot is transported with this potential well.

By means of a corresponding intersection or branch, it is possible using quantum dots to realize circuits not previously possible. As a result of such an electronic component, logic circuits can now be built in quantum computers. With this component, it is possible to interconnect a logic circuit.

The invention is based on the principle that a quantum mechanical state is set in a quantum dot, which can then be transported through the substrate over a longer distance. For this purpose, the quantum dot is confined in the potential well, which is generated in a suitable manner by the gate electrode assembly. The potential well then moves continuously and in a directed manner through the substrate and carries the quantum dot with its quantum mechanical state over the distance. To enable continuous movement of the potential well, the electrode fingers of the gate electrodes are connected accordingly. At the branch, the quantum dots are deflected to a potential well of a branching gate electrode assembly. The quantum dot must be moved in order to go in the other or a new direction. With the present invention, a quantum mechanical state of a quantum dot can thus be moved and a connection established over a greater distance.

In an advantageous embodiment of such an electronic component according to the invention, a third gate electrode assembly is provided for generating a switchable potential barrier arrangement in the region of the branch, which is switched for the transfer of the quantum dot. This potential barrier arrangement prevents the quantum dot from moving in a direction other than the direction prescribed by the branch. Depending on how the potential barrier arrangement is switched, the quantum dot is redirected with the potential well into the one or the other branching direction. In this manner, it is in particular also possible to realize complex circuits with changes in direction.

In a further advantageous embodiment of the electronic component, means for synchronizing the gate electrode assemblies are provided to change the direction of the quantum dot at the branch. The transfer of the quantum dot at a branch requires very precise coordination of the gate electrodes so that the potential well also actually transfers the quantum dot. The measure presented here thus serves to provide means for controlling the gate electrodes which connect the gate electrode assemblies synchronously to one another so that a coordinated change in direction becomes possible.

In a preferred embodiment of the electronic component, a gate electrode assembly comprises two parallel gate electrodes, which form a channel-like structure. This measure serves to ensure that the potential well can only move along a certain path in the substrate.

In an advantageous embodiment of such an electronic component, the substrate comprises gallium arsenide (GaAs) and/or silicon germanium (SiGe). These materials are able to form a two-dimensional electron gas in which quantum dots can be generated and moved. In the case of gallium arsenide, the quantum dots are occupied by electrons. In the case of silicon germanium, the quantum dots are occupied by holes that are missing an electron.

In a further preferred embodiment of the electronic component, the respectively interconnected gate electrodes are configured such that a periodic and/or phase-shifted voltage can be applied to them. This measure enables the potential well to be guided continuously through the substrate. A quantum dot located in the potential well can thus be transported through the substrate with the potential well while retaining its original quantum mechanical state.

In a preferred embodiment of the electronic component, at least every third electrode finger of a gate electrode is connected together. This is intended to ensure that the potential well is always guaranteed over at least one period through which the potential well is moved. Only in this way is it possible to ensure continuous movement of the potential well with the quantum dot. In principle, other combinations are also possible when interconnecting gate electrodes, as long as the potential well can be moved together with the quantum dot. Correspondingly, an advantageous embodiment for the method according to the invention for an electronic component is obtained in that at least every third gate electrode is connected together and a voltage is applied periodically to the interconnected gate electrodes.

In a further advantageous embodiment of the electronic component according to the invention, means are provided for connecting two qubits of a quantum computer. Transporting the states of quantum dots over greater distances is particularly suitable for quantum computers. In quantum computers, it is necessary to connect qubits to one another. For this reason, the electronic component must provide contacts to connect at least two qubits to one another in order to transfer the quantum states of the quantum dots from one qubit to another qubit.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is best defined by the appended claims. The prior art cited is considered part of the disclosure relating to the present invention.

DETAILED DESCRIPTION

Figure 1:
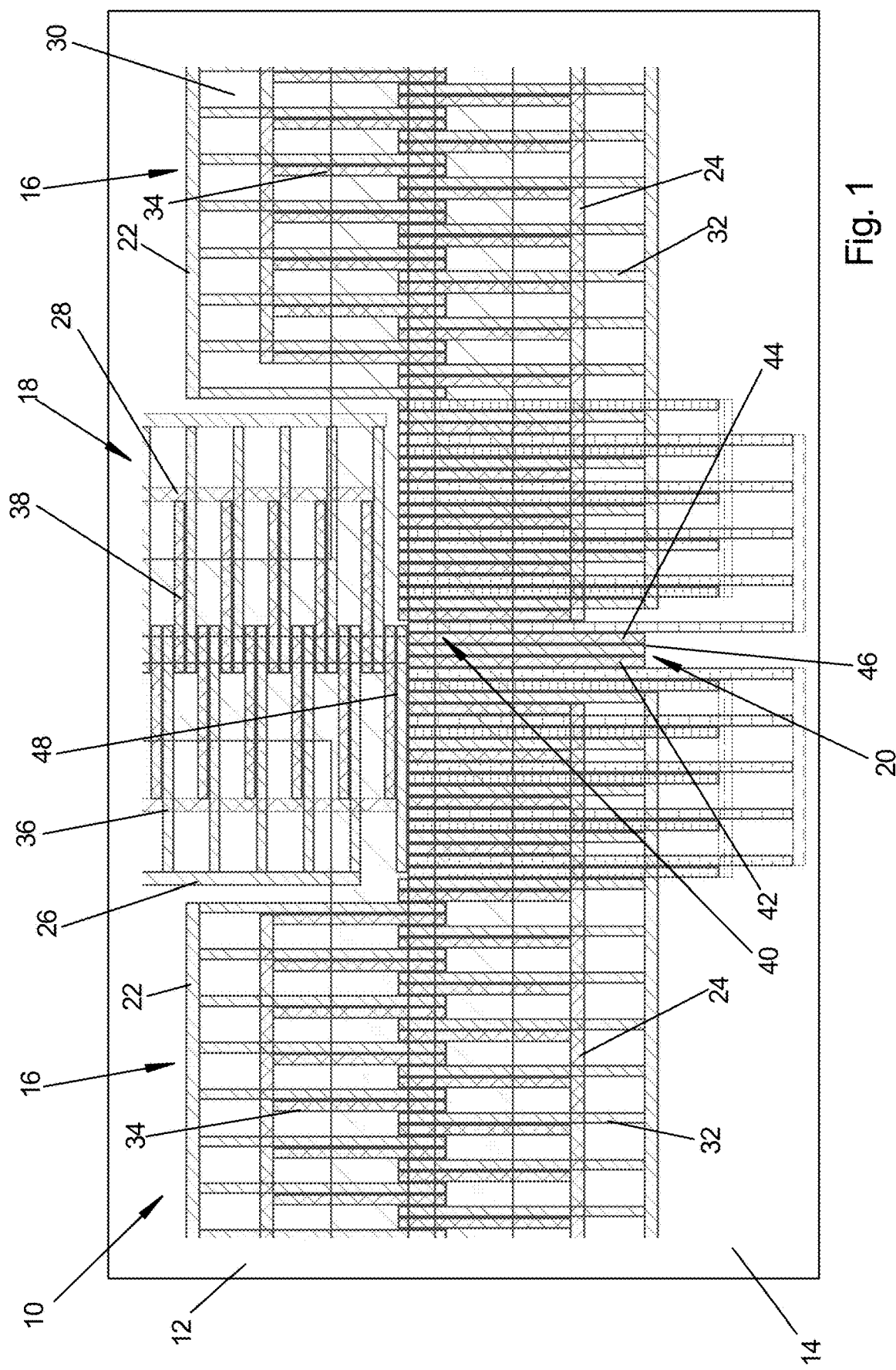
FIG. 1 shows a schematic top view of a first exemplary embodiment of an electronic component according to the invention, which has a branch.

FIG. 1 shows an exemplary embodiment of an electronic component 10 according to the invention, which is formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). Gate electrode assemblies 16, 18, 20 are provided on a surface 14 of the substrate 12.

The gate electrode assemblies 16, 18 each have two gate electrodes 22, 24, 26, 28. The individual gate electrodes 22, 24, 26, 28 are electrically isolated from one another in a suitable manner with insulating layers 30. The gate electrode assemblies 16, 18, 20 are structured in layers, wherein the insulating layer 24 is provided between each gate electrode 22, 24, 26, 28. The gate electrodes 22, 24, 26, 28 further comprise electrode fingers 32, 34, 36, 38, whereby each of the gate electrodes 22, 24, 26, 28 is arranged parallel to another on the surface 14 of the substrate 12.

The gate electrode assemblies 16, 18, 20 are supplied with a suitable voltage via electrical connections. By suitably applying sinusoidal voltages to the gate electrodes 22, 24, 26, 28 of the gate electrode assemblies 16, 18, 20, a potential well is formed in the substrate 12. A quantum dot trapped in this potential well can thus be transported through the substrate. The potential well is transported longitudinally through the substrate through suitable control of the electrode fingers 32, 34, 36, 38 with sinusoidal voltages. The quantum dot confined in such a potential well can be transported with this potential well over a greater distance in the two-dimensional electron gas of the substrate 12 made of SiGe without experiencing a quantum mechanical change of state.

The gate electrode assembly 18 branches off from the gate electrode assembly 16 in an intersection area 40. The gate electrode assembly 20 is arranged in the intersection area 40. In the present exemplary embodiment, the gate electrode assembly 20 contains two barrier gate electrodes 42, 44. These barrier gate electrodes 42, 44 can be connected when the moving potential well with the quantum dot is located in the intersection area 40. By connecting the barrier gate electrodes 42, 44, the potential well with the quantum dot is held in the intersection area 40. A pump gate electrode 46 of the gate electrode assembly 20 causes the potential well with the quantum dot to change direction and move toward the gate electrode assembly 18.

If no change in direction is to be performed by the potential well with the quantum dot, then a barrier gate electrode 48 of the gate electrode assembly 20 is switched on. The other two barrier gate electrodes 42, 44 are correspondingly switched off. The barrier gate electrode 48 blocks access to the gate electrode assembly 18. The quantum dot in the moving potential well is therefore not induced to change direction.

Figure 2:
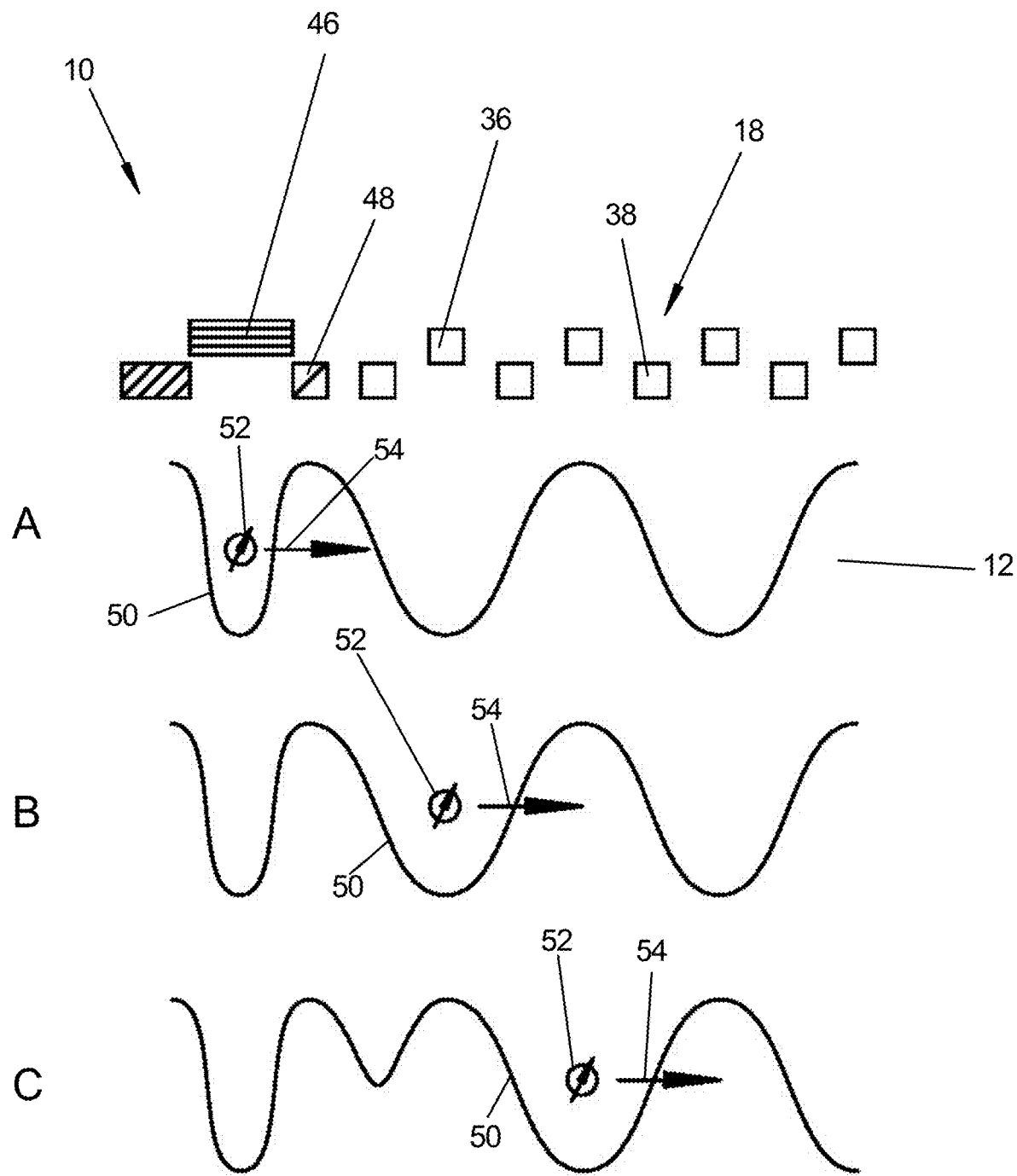
FIG. 2 shows a section of the branch according to FIG. 1 and the path of movement of a quantum dot in the branch.

FIG. 2 schematically illustrates a section through such an electronic component 10. The section of the component 10 shows a sequence of positions A to C of a movable potential well 50 with a quantum dot 52. In the illustration of the electronic component 10, only sectional diagrams of the electrode fingers 36, 38, the barrier gate electrodes 48, and the pump gate electrodes 46 are visible. Sequences from A to C of the positions of the potential well 50 in the substrate 12 are shown below this. The electrode fingers 36, 38 of the gate electrode assemblies 18 form the movable potential wells 50 through the substrate 12. The movement of the potential wells 50 is effected by appropriately interconnecting the electrode fingers 26, 28. The electrode fingers 36, 38 of the gate electrode assembly 16 provided for this purpose are periodically and alternately interconnected, which effects an almost continuous movement of the potential well 50 through the substrate 12. In the present figure, it is illustrated how the potential well 50 with the quantum dot 52 branches off the intersection area 40. The movable potential well 50 is located in the direction of the branching gate electrode 18. The arrow 54 symbolizes the direction in which the potential well 50 moves with the quantum dot 52.

LIST OF REFERENCE SIGNS

10 Electronic component
12 Substrate
14 Surface
16 Gate electrode assembly
18 Gate electrode assembly
20 Gate electrode assembly
22 Gate electrodes
24 Gate electrodes
26 Gate electrodes
28 Gate electrodes
30 Insulating layers
32 Electrode fingers
34 Electrode fingers
36 Electrode fingers
38 Electrode fingers
40 Intersection area
42 Barrier gate electrode
44 Barrier gate electrode
46 Pump gate electrode
48 Barrier gate electrode
50 Movable potential well
52 Quantum dot
54 Arrow

The invention claimed is:

1. An electronic component (10), which is formed by a semiconductor component or a semiconductor-like structure having gate electrode assemblies (16, 18, 20) for moving a quantum dot (52), comprising:
   a substrate (12) with a two-dimensional electron gas or electron hole gas;
   electrical contacts for connecting the gate electrode assemblies (16, 18, 20) to voltage sources;
   a first gate electrode assembly (16) having first gate electrodes (22, 24),
      the first gate electrode assembly (16) being arranged on a surface (14) of the electronic component, for producing a potential well (50) in the substrate (12),
      the first gate electrode assembly (16) having parallel first electrode fingers (32, 34),
      wherein the first electrode fingers (32, 34) are interconnected in a periodically alternating manner, which causes an almost continuous movement of the potential well (50) through the substrate (12), whereby the quantum dot (52) is transported in one direction together with this potential well (50);
   a second gate electrode assembly (18) having second gate electrodes (26, 28), the second gate electrode assembly (18) being provided with a different direction at a branch (40) to the first gate electrode assembly (16);
      the second gate electrode assembly (18) having parallel second electrode fingers (36, 38),
      wherein the second electrode fingers (36, 38) are interconnected in a periodically alternating manner, which causes an almost continuous further movement of the potential well (50) through the substrate (12), whereby the quantum dot (52) in the potential well (50) can be moved in a different direction of travel.

2. The electronic component (10) according to claim 1, wherein a third gate electrode assembly (20) is provided for generating a switchable potential barrier arrangement (42, 44, 48) in a region of the branch (40), which is switched for transferring the quantum dot (52).

3. The electronic component (10) according to claim 1, further comprising means for synchronizing the gate electrode assemblies (16, 18, 20) for transferring the quantum dot at the branch.

4. The electronic component (10) according to claim 1, wherein the first gate electrode assembly (16) and the second gate electrode assembly (18) each comprise two parallel gate electrodes (22, 24, 26, 28), which form a channel-like structure.

5. The electronic component (10) according to claim 1, wherein the substrate (12) of the electronic component (10) comprises gallium arsenide (GaAs) and/or silicon germanium (SiGe).

6. The electronic component (10) according to claim 1, wherein the first gate electrodes (22, 24) and the second gate electrodes (26, 28) are respectively interconnected and configured such that a periodic and/or phase-shifted voltage can be applied to them.

7. The electronic component (10) according to claim 1, wherein every third electrode finger (32, 34, 36, 38) is connected to a gate electrode (22, 24, 26, 28).

8. The electronic component (10) according to claim 1, further comprising means for connecting two qubits of a quantum computer.

9. The electronic component (10) according to claim 1, wherein the second gate electrode assembly (18) is provided with gate electrodes which generates a second movable potential well (50) in the substrate (12).

10. The electronic component (10) according to claim 1, wherein a magnetic field generator is provided for a switchable magnetic field and/or a gradient magnetic field.

11. A method for the electronic component (10) according to claim 1, comprising:
    applying a phase-shifted voltage to the first gate electrodes (22, 24) and the second gate electrodes (26, 28), which causes the almost continuous movement of the potential well (50) through the substrate (12), thereby transporting the quantum dot (52) with the potential well (50).

12. The method according to claim 11, wherein every fourth gate electrode (22, 24, 26, 28) is connected to one other and to which a periodic voltage is applied.

13. The method according to claim 11, wherein a potential barrier is switched to divert the quantum dot at the branch.

* * * * *